(12) United States Patent
Maeda

(10) Patent No.: US 6,933,615 B2
(45) Date of Patent: Aug. 23, 2005

(54) ELECTRONIC COMPONENT DEVICE AND MANUFACTURING METHOD THEREFOR

(75) Inventor: Takenobu Maeda, Omihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/752,521

(22) Filed: Jan. 8, 2004

(65) Prior Publication Data

US 2004/0178486 A1 Sep. 16, 2004

(30) Foreign Application Priority Data

Mar. 10, 2003 (JP) .................................. 2003-062721

(51) Int. Cl.[7] .............................................. H01L 23/48
(52) U.S. Cl. .................... 257/780; 257/781; 257/784; 257/775; 257/778
(58) Field of Search .............................. 257/780, 781, 257/784, 775, 778

(56) References Cited

U.S. PATENT DOCUMENTS

| | | | | |
|---|---|---|---|---|
| 5,252,519 A | | 10/1993 | Nakatani et al. | |
| 5,959,353 A | * | 9/1999 | Tomita | 257/729 |
| 6,013,356 A | * | 1/2000 | Horiguchi et al. | 428/210 |
| 6,265,300 B1 | | 7/2001 | Bhansali et al. | |
| 6,452,264 B2 | * | 9/2002 | Nishide et al. | 257/703 |
| 6,509,641 B2 | * | 1/2003 | Tateoka et al. | 257/700 |
| 6,657,311 B1 | * | 12/2003 | Hortaleza et al. | 257/778 |
| 2002/0027282 A1 | * | 3/2002 | Kawakami et al. | 257/700 |
| 2003/0057537 A1 | | 3/2003 | Iwasaki et al. | |
| 2004/0195672 A1 | * | 10/2004 | Takeoka et al. | 257/700 |

FOREIGN PATENT DOCUMENTS

| | | |
|---|---|---|
| JP | 63-288031 | 11/1988 |
| JP | 2002-164643 | 6/2002 |
| JP | 2002-184812 | 6/2002 |

* cited by examiner

Primary Examiner—Jasmine Clark
(74) Attorney, Agent, or Firm—Keating & Bennett, LLP

(57) ABSTRACT

In an electronic component device, electrodes of an electric component and respective wiring lines on a board are collectively bonded together via bumps using ultrasonic vibration. The wiring lines include wiring lines that are substantially parallel to the direction of ultrasonic vibration and wiring lines that are substantially perpendicularly to the direction of ultrasonic vibration. A displacement inhibiting layer is provided inside the board in a portion below the wiring lines that are substantially perpendicular to the direction of ultrasonic vibration.

17 Claims, 11 Drawing Sheets

PERPENDICULAR WIRING LINE

PARALLEL WIRING LINE

PERPENDICULAR WIRING LINE

PARALLEL WIRING LINE

ELECTRONIC COMPONENT DEVICE AND MANUFACTURING METHOD THEREFOR

BACKGROUND OF THE INVENTION

1. Field of the Invention

The present invention relates to an electronic component device formed by mounting an electronic component on a board via bumps, and more specifically, the present invention relates to an electronic component device implemented by using a flip chip bonding method.

2. Description of the Related Art

To date, regarding a flip chip bonding method for bonding bumps and respective wiring patterns on a board together, Japanese Unexamined Patent Application Publication No. 63-288031 discloses a flip chip bonding method in which bumps formed on respective electrodes of a semiconductor chip are aligned with respective wiring patterns on a board disposed on a heated stage, and in which pressure and ultrasonic vibration are applied to the rear surface of the chip via a tool, thereby bonding the bumps and the respective wiring patterns together.

FIG. 1 shows an example of an electronic component device. FIG. 2 illustrates a bonding method for this electronic component device. FIG. 3 shows a board of the electronic component device. Here, reference numeral 1 denotes a board, 2a and 2b each denote a wiring line, 3 denotes a bump, and 4 denotes an electronic component.

The wiring lines 2a and 2b are longitudinally and laterally arranged on the board 1, and the bumps 3 are formed in advance on respective electrodes (not shown) of the electronic component 4. The top surface of the electronic component 4 is pressed by a bonding tool 5 and is subjected to ultrasonic vibration U along a horizontal direction via the bonding tool 5, whereby the bumps 3 are bonded to the respective wiring lines 2a and 2b.

In this way, the electronic component 4 and the wiring patterns on the board 1 are bonded together in a collective manner. This inevitably results in wiring lines extending perpendicularly to the direction of ultrasonic vibration U (hereinafter referred to as "perpendicular wiring lines") 2a, and wiring lines extending parallel to the direction of ultrasonic vibration U (hereinafter referred to as "parallel wiring lines") 2b being present in a mixed state. When ultrasonic vibration acts on the board 1, the board 1 attempts to deform. However, the wiring lines 2a and 2b, which have higher rigidity than the board 1, attempt to inhibit the deformation. The perpendicular wiring lines 2a, however, exhibit a small deformation inhibiting effect as compared with the parallel wiring lines 2b, which are arranged along the longitudinal direction with respect to the ultrasonic vibration, so that the perpendicular wiring lines 2a are displaced more than the parallel wiring lines 2b, as shown in FIGS. 4A and 4B (here, reference numeral 6 denotes an electrode of the electronic component 4, and a symbol δ denotes a displacement).

As a result, sufficient ultrasonic vibration does not travel to bonding interfaces between the perpendicular wiring lines 2a and the respective bumps 3, thereby making the bonding of the perpendicular wiring lines 2a imperfect as compared with the parallel wiring lines 2b. In one electronic component, if such variations in bondability occur due to the directions of wiring lines, wiring lines that are bonded earlier and those that are bonded later become mixed with each other. This causes a problem in that, when much time is spent applying ultrasonic waves until all wiring lines are sufficiently bonded, the wiring lines that are bonded earlier begin to crack.

Table 1 shows analysis results using a finite-element method, on a displacement of the wiring line and that of the board surface when a forced displacement of 1 μm is statically applied to the chip surface as ultrasonic vibration.

TABLE 1

|   |   | Parallel wiring line | Perpendicular wiring line |
|---|---|---|---|
| A | Displacement of wiring line [μm] | 0.66 | 0.75 |
| B | Displacement of board surface [μm] | 0.48 | 0.55 |
|   | Deformation amount of wiring line (A–B) | 0.18 | 0.20 |
|   | Deformation amount of board (equal to B) | 0.48 | 0.55 |

As shown in Table 1, the perpendicular wiring line exhibits a larger displacement than the parallel wiring line. While ultrasonic vibration is applied, displacements repeatedly occur, thereby causing a difference in bondability between the perpendicular wiring line and the parallel wiring line. As an example showing the relationship between the displacement and the bondability, FIG. 5 shows the relationship between the displacement of wiring line and the bonding strength. As can be seen from FIG. 5, the larger the displacement, the smaller the bonding strength.

When electronic components with such a difference in bondability were bonded with much expenditure of time applying ultrasonic waves, cracking in chip electrodes occurred in 10 to 50 percent of the electronic components.

To solve the above-described problem, Japanese Unexamined Patent Application Publication No. 2002-184812 proposes that, in order to make displacements of wiring lines due to ultrasonic vibration substantially uniform, the connecting section of each of the wiring lines of which the angle θ with respect to a direction of ultrasonic vibration is larger, was formed wider than the connecting section of each of the wiring lines of which the angle θ with respect to the direction of ultrasonic vibration is smaller, thereby bringing all wiring lines into a substantially uniform bonding state. More specifically, the width of each of the perpendicular wiring lines was made wider than that of each of the parallel wiring lines.

In this case, however, the connecting section of each of the perpendicular wiring lines must be formed wider and, therefore, if wiring lines are arranged at a high density, it is difficult to secure a sufficient formation width. This make it difficult to bring all wiring lines into a uniform bonding state.

SUMMARY OF THE INVENTION

Accordingly, in order to overcome the problems described above, preferred embodiments of the present invention provide an electronic component device that is capable of making displacements of wiring lines due to ultrasonic vibration substantially uniform and is also capable of bringing all wiring lines into substantially a uniform bonding state, even when wiring lines are arranged at a high density, and also provide a method for manufacturing the same.

According to a preferred embodiment of the present invention, an electronic component device includes a plurality of wiring lines arranged on a board along different directions from each other, and in which a plurality of electrodes of an electronic component is collectively bonded to the respective plurality of wiring lines via respective bumps using ultrasonic vibration. This electronic component device includes a displacement inhibiting layer having higher rigidity than the material of the board, the displacement inhibiting layer being provided inside the board in a portion below each of the wiring lines, and an angle between the wiring lines having the displacement inhibiting layers therebelow and a direction of the ultrasonic vibration is larger than an angle between the wiring lines not having the displacement inhibiting layers formed therebelow and the direction of ultrasonic vibration.

In another preferred embodiment of the present invention, a method for manufacturing an electronic component device includes a step of preparing a board having a plurality of wiring lines formed on a top surface thereof in different directions, wherein a displacement inhibiting layer having higher rigidity than the material of the board is provided inside the board in a portion below each of the wiring lines arranged along one direction out of the wiring lines, a step of preparing an electronic component in which bumps are formed on respective electrodes thereof provided on one main surface thereof, and a step of opposing the bumps on the electronic component to the respective wiring lines on the board and collectively bonding them together using ultrasonic vibration, wherein the ultrasonic vibration is applied in a state where the angle $\theta$ formed between a direction of the ultrasonic vibration and the direction of the wiring lines each having the displacement inhibiting layer is larger than the angle $\theta$ formed between the direction of the ultrasonic vibration and the direction of the other wiring lines not having the displacement inhibiting layer.

For example, bumps are formed on electrodes of an electric component in advance, and these bumps are bonded, using ultrasonic vibration, to respective wiring lines on a board, which face the respective bumps. In this case, wiring lines of which the angle $\theta$ with respect to the direction of ultrasonic vibration is larger, and wiring lines of which the angle $\theta$ with respect to the direction of ultrasonic vibration is smaller, become mixed with each other. However, in preferred embodiments of the present invention, since a displacement inhibiting layer having higher rigidity than the material of the board is provided inside the board in a portion below each of the wiring lines of which the angle $\theta$ with respect to the direction of ultrasonic vibration is larger, it is possible to make displacements of the wiring lines due to ultrasonic vibration substantially uniform, and to bring all wiring lines into a substantially uniform bonding state irrespective of the magnitude relationship of the angle $\theta$. This inhibits the occurrence of imperfect bonding and cracking.

Furthermore, since it is unnecessary to increase the width of the wiring line, there is no problem even when wiring lines are arranged at a high density.

The materials of board preferably include resin and ceramic materials. The ceramic material, which has high rigidity, is low in displacement due to ultrasonic vibration. In contrast, the board made of resin, which experiences large displacements due to ultrasonic vibration, is subject to variations in bondability. Therefore, preferred embodiments of the present invention exert a larger effect when a resin board is used.

In the electronic component device according to a preferred embodiment of the present invention, it is preferable that first wiring lines extending substantially parallel to the direction of ultrasonic vibration and second wiring lines extending substantially perpendicular to the direction of the ultrasonic vibration be arranged on the board along the directions that are substantially perpendicular to each other, and that the displacement inhibiting layer be provided inside the board in a portion below each of the second wiring lines.

The direction of ultrasonic vibration and that of wiring lines can be arbitrarily set. When there are provided the first wiring lines, which extend substantially parallel to the direction of ultrasonic vibration, and the second wiring lines, which extend substantially perpendicularly to the direction of ultrasonic vibration, forming the displacement inhibiting layer in a portion below the second wiring layer maximizes the advantages of preferred embodiments of the present invention.

In the electronic component device according to various preferred embodiments of the present invention, when a plurality of the above-described second wiring lines is arranged adjacent to each other, the displacement inhibiting layer is preferably disposed in a portion below the plurality of the second wiring lines so as to be continuous.

An alternative method for providing the displacement inhibiting layer is to form each of the displacement inhibiting layers in a portion below a respective one of the second wiring lines in an independent manner. However, in comparison with this alternative method, providing the displacement inhibiting layer in a portion below a plurality of the second wiring lines so as to be continuous as described above, allows even the displacement of a board portion situated between the second wiring lines to be inhibited by the displacement inhibiting layer, thereby increasing the displacement inhibiting effect with respect to the second wiring lines.

However, it is unnecessary for the displacement inhibiting layer to be continuous with respect to all second wiring lines. The displacement inhibiting layer has only to be continuous with respect to at least two adjacent wiring lines.

In the electronic component device according to various preferred embodiments of the present invention, it is preferable that the displacement inhibiting layer be provided in a region within, for example, about 1 mm of the surface of the board.

In order to effectively prevent the displacement of the wiring line due to ultrasonic vibration, it is desirable that the displacement inhibiting layer be provided as close to the board surface having thereon the wiring line as possible. For example, when the board is a resin board, the displacement inhibiting layer is preferably provided in a region within, for example, about 1 mm of the board surface. The closer to the board surface, the more effective the displacement inhibiting layer. It is therefore more preferable that the displacement inhibiting layer be provided in a region within, for example, about 10 $\mu$m to about 150 $\mu$m of the board surface.

In the electronic component device according to various preferred embodiments of the present invention, the board may be a multilayer printed wiring board, and the displacement inhibiting layer may be a conductor pattern provided in an inner layer of the multilayer printed wiring board.

When the board is a multilayer printed wiring board, a conductor pattern is provided in an inner layer thereof besides wiring patterns on outer layers of both sides of the board, and therefore, by using one of these conductor patterns as a displacement inhibiting layer, it is possible to easily form a displacement inhibiting layer without using a special technique, and also to provide the displacement inhibiting layer with a function as a ground or a shield.

Other features, elements, characteristics and advantages of the present invention will become more apparent from the following detailed description of preferred embodiments of the present invention.

DETAILED DESCRIPTION OF PREFERRED EMBODIMENTS

Figure 1:
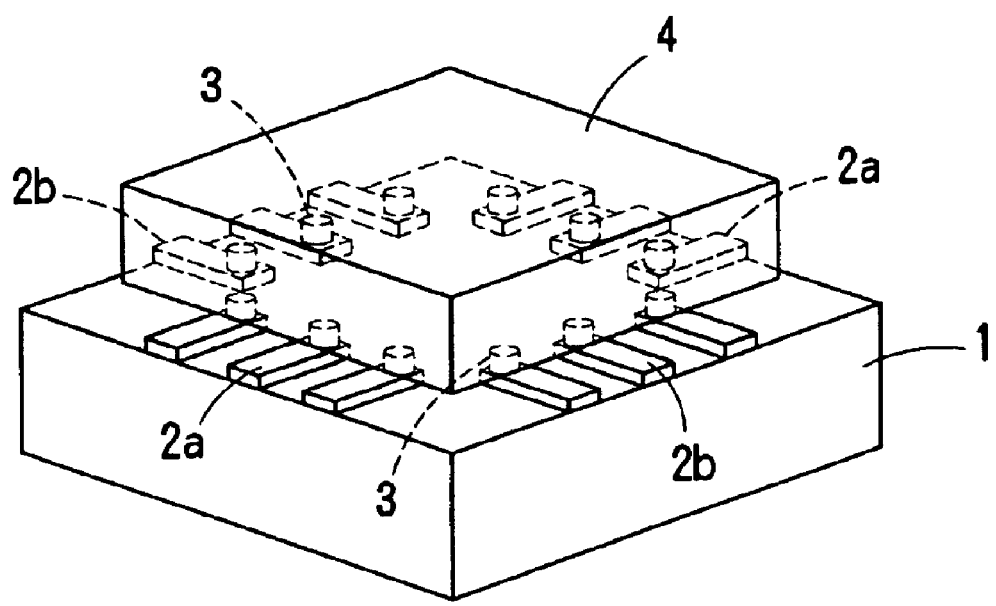
FIG. 1 is a perspective view showing the construction of a common electronic component device.
Figure 2:
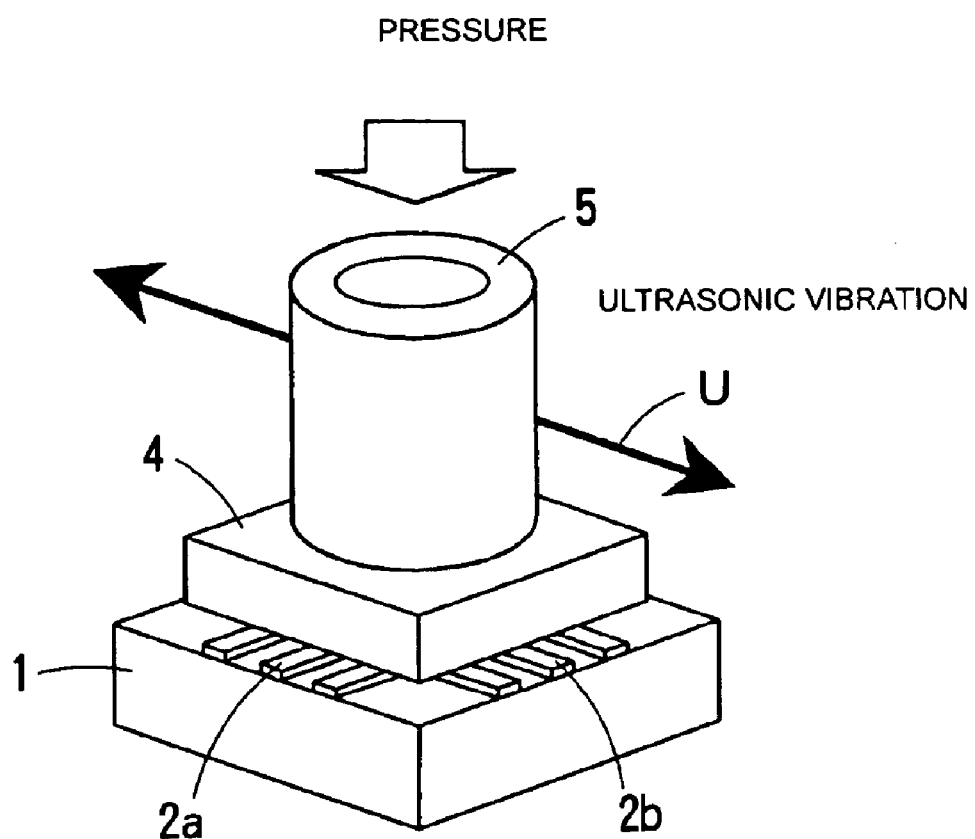
FIG. 2 is a perspective view illustrating a bonding method for the electronic component device shown in FIG. 1.
Figure 3:
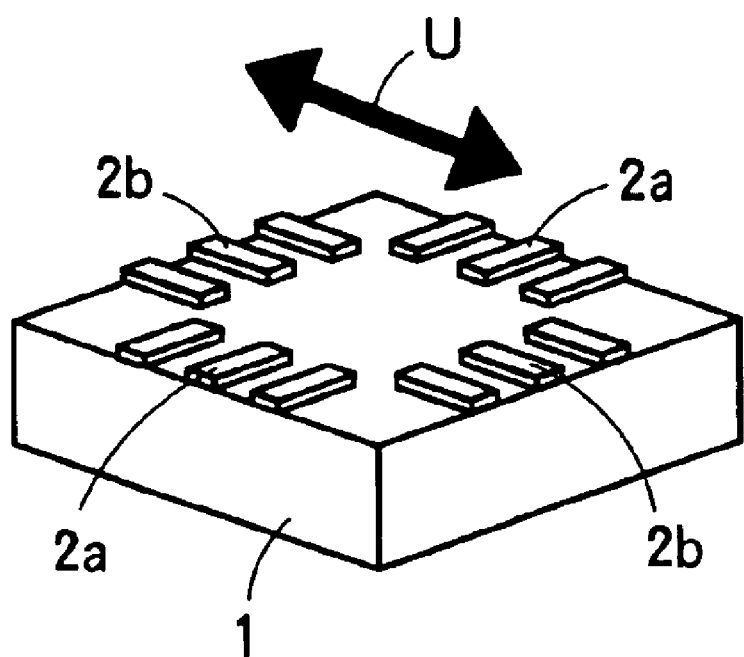
FIG. 3 is a perspective view of a board used for the electronic component device shown in FIG. 1.
Figure 4A:
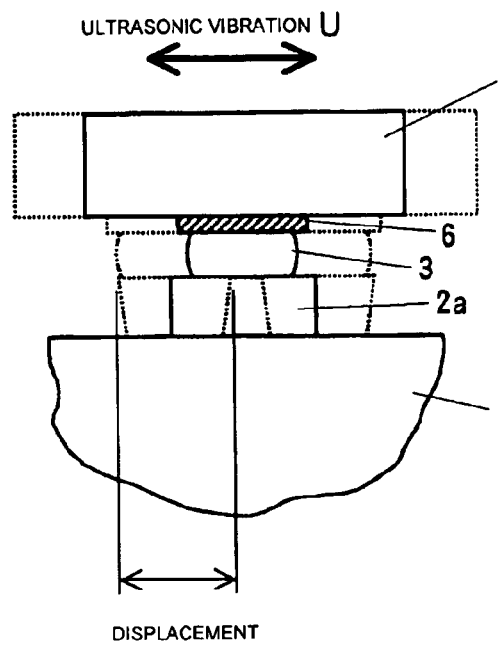
FIGS. 4A and 4B are representations of displacements of a substantially perpendicular wiring line and a substantially parallel wiring line, respectively, when they are subjected to ultrasonic vibration.
Figure 4B:
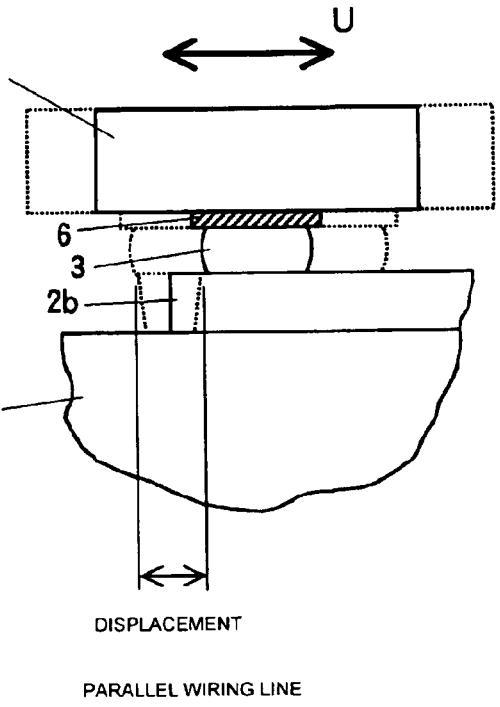
Figure 5:
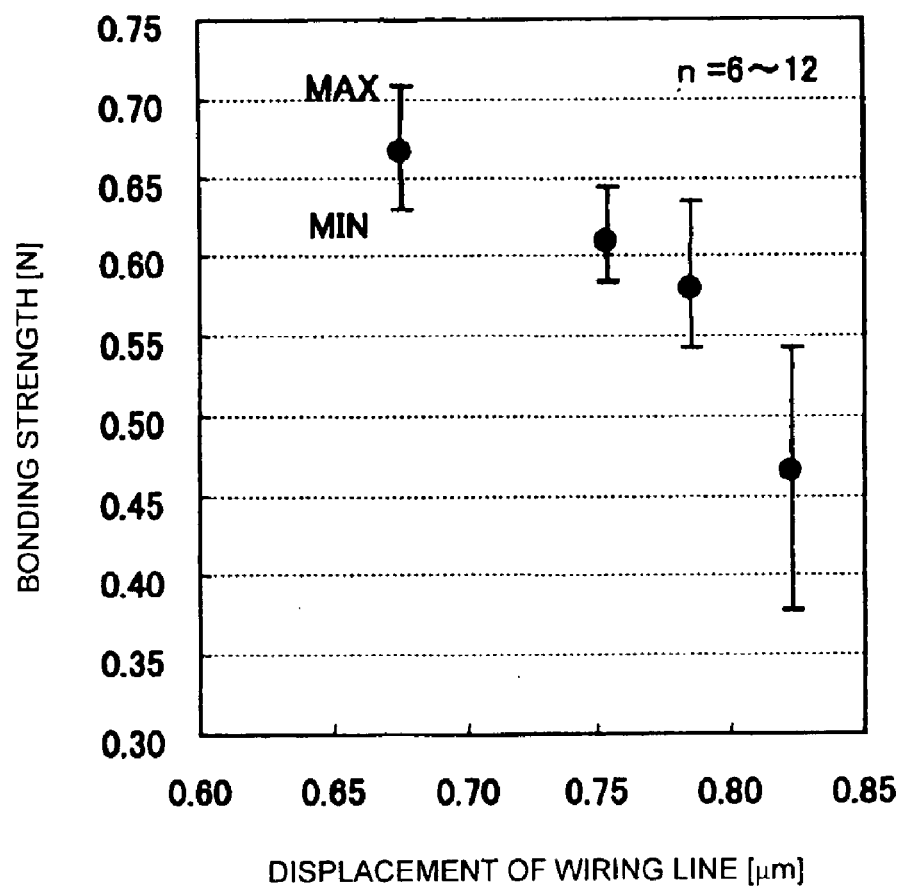
FIG. 5 is a graph showing the relationship between the displacement of wiring line and the bonding strength.
Figure 6:
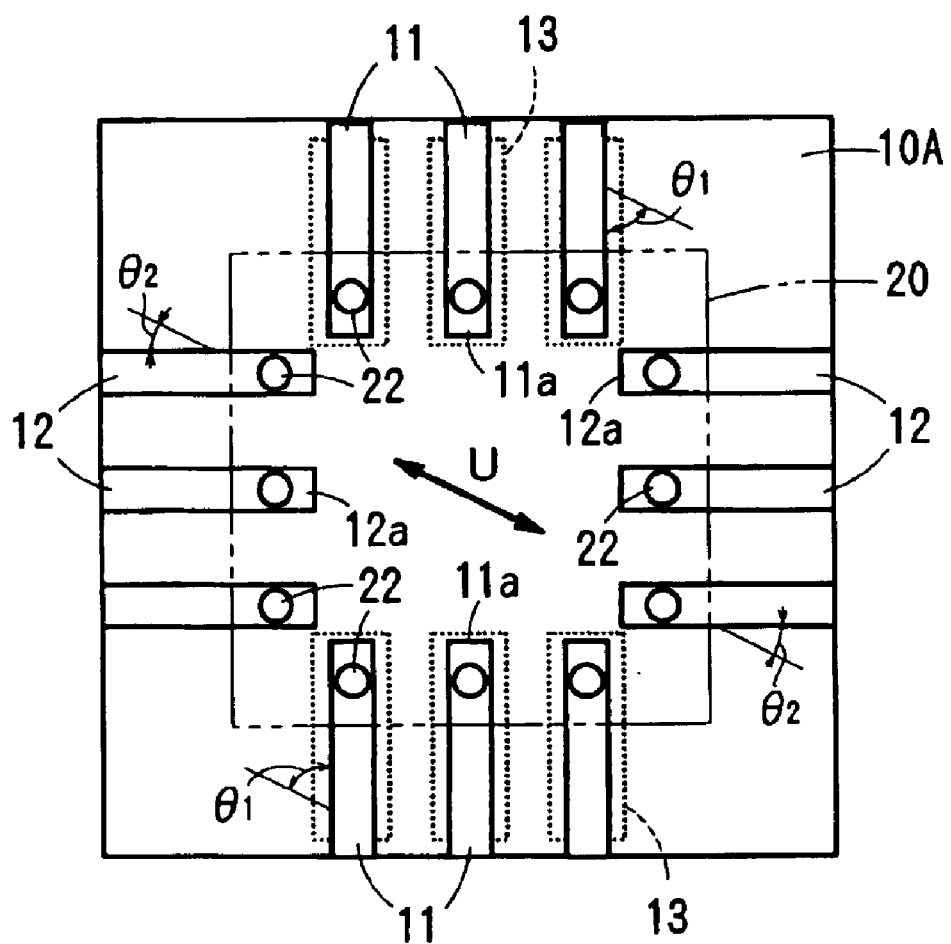
FIG. 6 is a plan view of an electronic component device according to a first preferred embodiment of the present invention.
Figure 7:
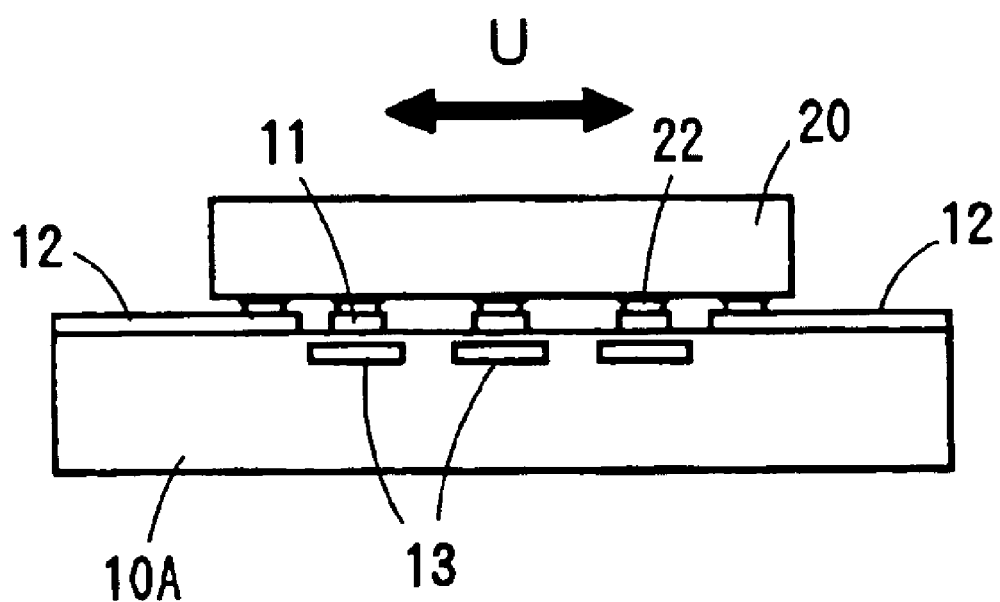
FIG. 7 is a side view of the electronic component device shown in FIG. 6, when subjected to bonding.
Figure 8A:
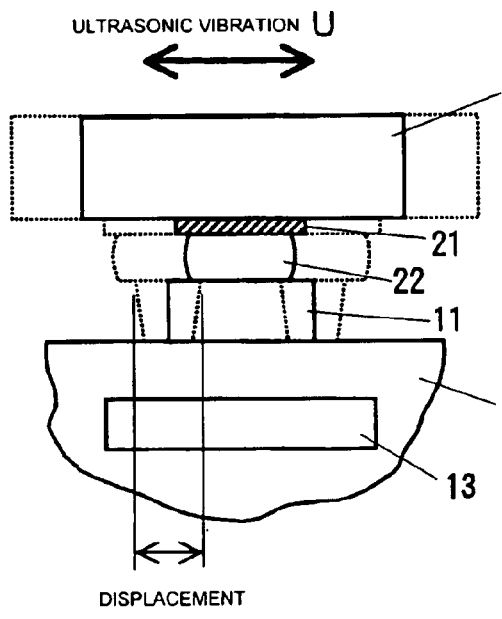
FIGS. 8A and 8B are partially enlarged sectional views of the board shown in FIG. 7.
Figure 8B:
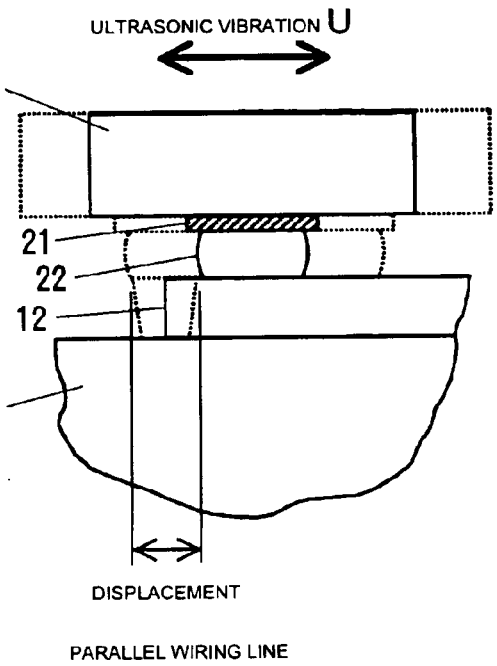

An electronic component device according to a first preferred embodiment of the present invention will be described with reference to FIGS. 6 to 8. FIG. 6 is a plan view of this electronic component device. FIG. 7 is a side view of the electronic component device. FIGS. 8A and 8B are each an enlarged sectional view of a bonding portion.

A board 10A preferably includes an organic board made of a material such as glass epoxy resin or bismaleimide triazine (BT) resin, a ceramic board such as alumina, or a crystal board made of silicon or other suitable material. A plurality of wiring lines 11 and 12 that extend along directions that substantially perpendicularly intersect each other is formed on the board 10A. As shown in FIG. 6, each of the wiring lines 11 is arranged so as to form an angle $\theta_1$ with respect to a direction of ultrasonic vibration U (described below) that is larger than approximately 45° ($\theta_1 > 45°$), and each of the wiring lines 12 is arranged to form an angle $\theta_2$ with respect to the direction of ultrasonic vibration U that is smaller than approximately ($\theta_2 < 45°$). Thus, the angle $\theta_1$ is greater than the angle $\theta_2$.

The descriptions hereinafter are made of examples of the wiring lines 11 each of which forms an angle $\theta_1 = 90°$ with the direction of ultrasonic vibration U, i.e., wiring lines each of which is arranged along the direction that is substantially perpendicular to the direction of ultrasonic vibration U (namely, substantially perpendicular wiring lines), and the wiring lines 12 each of which forms an angle $\theta_2 = 0°$ with the direction of ultrasonic vibration U, i.e., wiring lines each of which is arranged along the direction that is substantially parallel to the direction of ultrasonic vibration U (namely, substantially parallel wiring lines).

Regarding the substantially perpendicular wiring lines 11, displacement inhibiting layers 13 having higher rigidity than the board material are provided inside the board 10A in portions below the substantially perpendicular wiring lines 11. In this preferred embodiment, each individual displacement inhibiting layer 13 is provided in a portion below a respective one of the substantially perpendicular wiring lines 11. The displacement inhibiting layers 13 are provided in a region corresponding to the electronic component mounting portion (indicated by a chain double-dashed line in FIG. 6), of the substantially perpendicular wiring lines 11, that is, in a region including land portions 11a and 12a. Here, a "portion below a wiring line" refers to, for example, "a region within about 1 mm of the surface of the board". However, it is desirable that the displacement inhibiting layer be arranged as close to the board surface as possible. Preferably, the displacement inhibiting layer is provided in a region, for example, within about 10 μm to about 150 μm of the board surface. The material of the displacement inhibiting layer 13 is preferably a metallic material such as Cu, or a ceramic material, with high rigidity material, such as alumina, or other suitable material. An organic board preferably has a rigidity in a range of about 10 GPa to about 60 GPa, whereas a Cu material has rigidity of about 120 GPa or more, although the rigidity changes with temperature. Therefore, when an organic board is used as the board 10A, a Cu material can function effectively as the displacement inhibiting layer 13.

The shape of the board 10A is not particularly limited. The thickness of the board 10A can also be arbitrarily set, for example, to be in a range of about 0.2 mm to about 2 mm. The wiring lines 11 and 12 are formed preferably by using a plating method, thin film forming method, or thick film forming method, or other suitable method. The thickness of the wiring line is preferably in a range of several micrometers to several tens of micrometers, but is not restricted to this range. In this preferred embodiment, the wiring lines 11 and 12 used were formed by applying electrolytic plating or electroless plating of Ni (approximately 3 μm thick) or Au (approximately 0.03 μm or more thick) to Cu foil with a thickness in a range of about 5 μm to about 35 μm.

Here, the widths of the wiring lines 11 and 12 are preferably made substantially the same. However, the widths as well as the shapes of the wiring lines 11 and 12 may be different from each other. Also, the arrangement may be such that the region corresponding to the electronic component mounting portion (the portion indicated by the chain double-dashed line in FIG. 6), of the wiring lines 11 and 12, that is, the region including the land portions 11a and 12a, are exclusively exposed to the outside, and that the other region is covered with an insulating material such as resist.

The electronic component 20 preferably is, for example, a semiconductor chip or a surface acoustic wave (SAW) device. On the bottom surface of the electronic component 20, electrode pads 21 (see FIGS. 8A and 8B) preferably made of Al or AU material of, e.g., about 100 μm square are formed in positions corresponding to the land portions 11a and 12a. Bumps 22 are formed on the respective electrode pads 21, preferably using a plating method, wire-bonding method, or vapor deposition method, or other suitable method. Au, Ag, Pd, Cu, Al, or solder, or other suitable material, is usable for the bumps 22.

As described below, the bumps 22 are collectively bonded to the respective land portions 11a and 12a of the wiring lines 11 and 12 by applying, to the electronic component 20, ultrasonic vibration, a load, and further heat, if necessary.

Next, a method for flip-chip bonding the electronic component 20 to the board 10A will be described.

First, bumps 22 are formed on the respective electrode pads 21 of the electronic component 20. By a bonding tool (not shown), the top surface (rear surface) of the electronic component 20 is attracted, and the electronic component 20 is picked up. Then, the bumps 22 are aligned with the respective land portions 11a and 12a of the wiring lines 11 and 12 of the board 10A, with a high degree of accuracy. Thereafter, the bumps 22 of the electronic component 20 and the respective land portions 11a and 12a of the wiring lines 11 and 12 of the board 10A are brought into contact. In this state, ultrasonic vibration U at a frequency in a range of, e.g., about 20 kHz to about 150 kHz is applied to the top surface of the electronic component 20 in the direction that is substantially parallel to the surface of the board 10A, and simultaneously in the direction that is substantially perpendicular to the substantially perpendicular wire lines 11 (i.e., in the direction that is substantially parallel to the parallel wiring lines 12) via the bonding tool, thereby bonding the bumps 22 and the respective land portions 11a and 12a together. During the bonding, a load may be applied between the board 10A and the electronic component 20, and either of the board 10A and the electronic component 20 may be heated.

After the above-described bonding has been completed, for the purpose of securing bonding reliability, the gap between the electronic component 20 and the board 10A may be subjected to resin sealing to mitigate the difference in linear expansion between the electronic component 20 and the board 10A, and to protect the bonding portion. The resin sealing may be performed by applying resin after the bonding between the electronic component 20 and the board 10A. Alternatively, the resin sealing may be performed such that resin is applied to the wiring lines on the board in advance, and such that the bumps are bonded to the respective wiring lines on the board while breaking through the resin layer. In this case, bonding and resin sealing can be concurrently achieved.

When applying ultrasonic vibration U, the substantially perpendicular wiring lines 11 exhibit low rigidity with respect to the vibration direction compared with the substantially parallel wiring lines 12. However, since the substantially perpendicular wiring lines 11 each have a displacement inhibiting layer 13 formed therebelow, the difference in displacement between the substantially perpendicular wiring lines 11 and the substantially parallel wiring lines 12 decreases, as shown in FIGS. 8A and 8B. As a result, the variation in the bondability with respect to the bumps 13 between the substantially perpendicular wiring lines 11 and the substantially parallel wiring lines 12 is reduced, and thereby substantially uniform bonding strength can be achieved. This prevents the occurrence of imperfect bonding and cracking in the electrodes.

Figure 9:
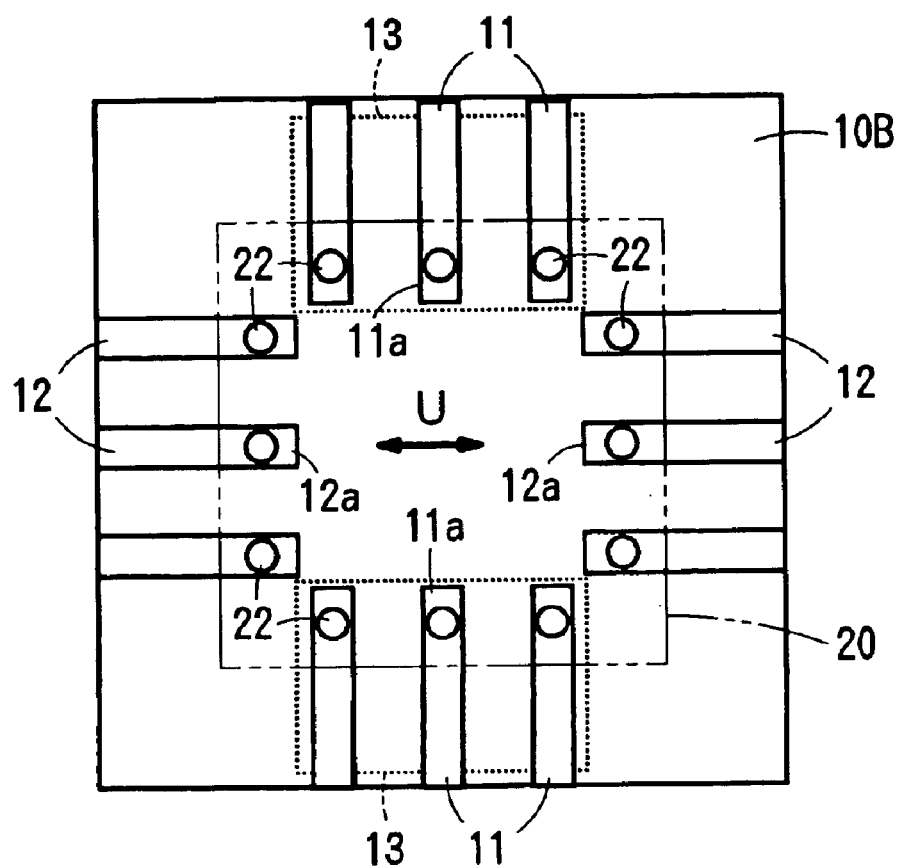
FIG. 9 is a plan view of a board according to a second preferred embodiment of the present invention.
Figure 10:
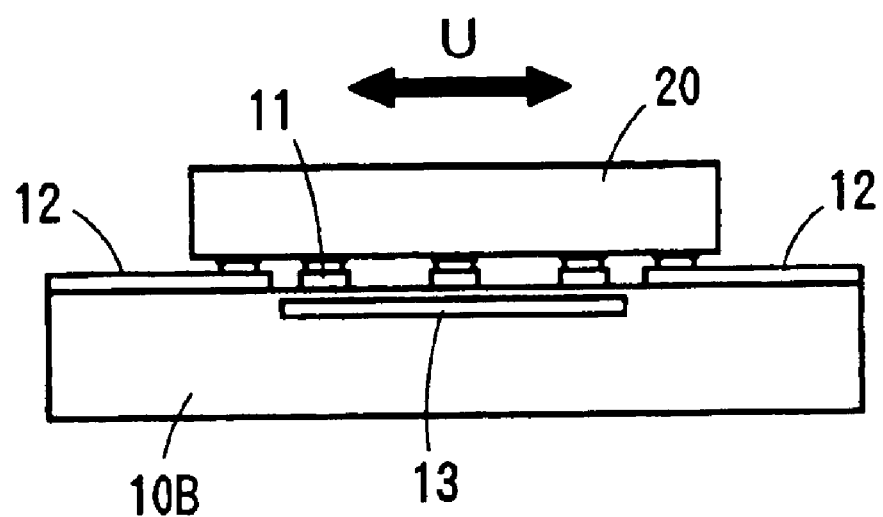
FIG. 10 is a side view of the electronic component device shown in FIG. 9.

FIGS. 9 and 10 show an electronic component device according to a second preferred embodiment of the present invention. In FIGS. 9 and 10, the same elements as those in FIGS. 6 and 7 are denoted by the same reference numerals.

As in the case of the first preferred embodiment, a board 10B has thereon a plurality of wiring lines 11 and 12 that are formed along directions that substantially perpendicularly intersect each other. Displacement inhibiting layers 13 having higher rigidity than the board material are provided inside the board 10B in portions below the substantially perpendicular wiring lines 11. The displacement inhibiting layer 13 in this preferred embodiment is arranged so as to be continuous with respect to a plurality of substantially perpendicular wiring lines 11 (three in this case). More specifically, even portions situated between adjacent substantially perpendicular wiring lines 11 are provided with the displacement inhibiting layer 13.

In this preferred embodiment, since the portions of the board 10B that are situated between the substantially perpendicular wiring lines 11 are also prevented from being displaced because of the displacement inhibiting layer 13, the displacement of the substantially perpendicular wiring lines 11 and their peripheries due to ultrasonic vibration is reliably prevented. This further reduces the displacement difference from the substantially parallel wiring lines, resulting in more uniform bonding strength.

Using the implementation model shown in FIGS. 9 and 10, an analysis by a finite-element method was performed, in a case where displacement inhibiting layers having a thickness of, for example, 70 $\mu$m, made of Cu are provided in portions below the substantially perpendicular wiring lines, i.e., in positions at a distance of about 30 $\mu$m from the board surface. According to the results of the analysis, the difference in displacement between the substantially perpendicular wiring line and the substantially parallel wiring line is about 0.03 $\mu$m. In contrast, the difference in the displacement obtained without using displacement inhibiting layers was about 0.09 $\mu$m. That is, the use of displacement inhibiting layers reduces the difference in displacement by a factor of about 3. Thus, the bondability of all bonding portions is made substantially uniform, thereby preventing the occurrence of damage.

Figure 11:
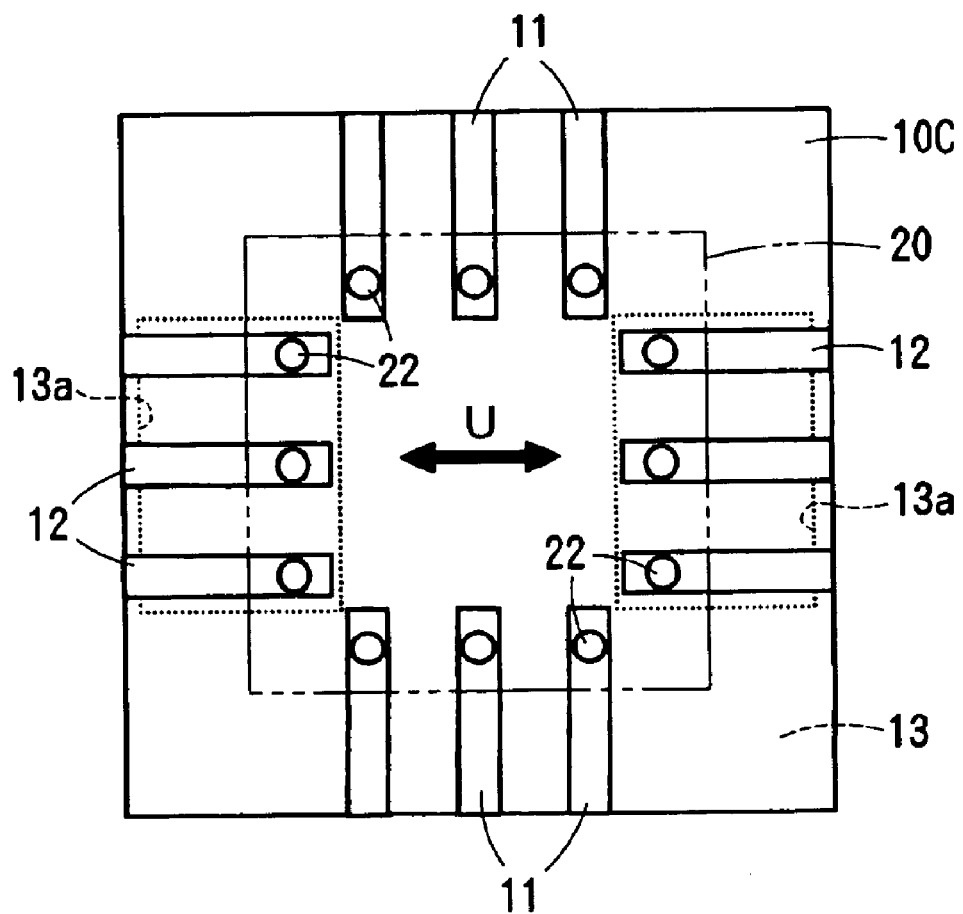
FIG. 11 is a plan view of a board according to a third preferred embodiment of the present invention.

FIG. 11 shows an electronic component device according to a third preferred embodiment of the present invention. In FIG. 11, the same elements as those in FIGS. 6 and 7 are denoted by the same reference numerals.

A board 10C in this preferred embodiment is arranged so that portions having no displacement inhibiting layer 13 are limited to portions below the substantially parallel wiring lines 12. In other words, displacement inhibiting layers 13 are provided over substantially the entire region inside the board 10C. In addition, window holes 13a are provided in portions of the displacement inhibiting layers 13, corresponding to the portions below the substantially parallel wiring lines 12.

Thus, it is possible to more effectively inhibit displacements of the substantially perpendicular wiring lines 11 and their peripheries due to ultrasonic vibration, and also to provide the displacement inhibiting layers 13 with a function as a ground or a shield.

In general, a printed wiring board having three layers or more of conductor patterns is referred to as a "multilayer printed wiring board". Specifically, this indicates a board in which conductor patterns (commonly Cu) are provided in an inner layer thereof, in addition to circuit patterns disposed on outer layers of both surfaces of the board. In such a multilayer printed wiring board, providing the conductor pattern in the inner layer having higher rigidity than the resin layer, as a displacement inhibiting layer, allows the advantages of preferred embodiments of the present invention to be easily obtained without using a special technique. Furthermore, applying preferred embodiments of the present invention to commodity products including a multilayer printed wiring board allows the advantages of preferred embodiments of the present invention to be achieved without causing an increase in cost.

The present invention is not limited to the above-described preferred embodiments. In the above-described preferred embodiments, the bumps are preferably formed on the electronic component. However, by forming bumps on the respective wiring lines on the board in advance, and then bonding these bumps to the respective electrode pads of the electronic component, similar advantages can also be obtained.

In the above-described preferred embodiments, an example was shown in which wiring lines along the directions that are substantially perpendicular and substantially parallel to the direction of ultrasonic vibration are provided on the surface of the board. However, wiring lines may be provided along directions that are inclined with respect to the direction of ultrasonic vibration.

Also, in the above-described preferred embodiments, the widths of the substantially perpendicular wiring line and the substantially parallel wiring line are preferably substantially equal. However, the width of the substantially perpendicular wiring line, which has a displacement inhibiting layer, may be wider than that of the substantially parallel wiring line. This offers the advantage of increasing flexibility in the design of the widths of the displacement inhibiting layer and the substantially perpendicular wiring line.

The material of the board is not particularly restricted. However, when a resin board is used, and bonding is performed by a combined usage of thermocompression bonding and ultrasonic vibration, preferred embodiments of the present invention provides more advantageous results. This is because, when using a resin board, performing bonding by the combined usage of thermocompression bonding and ultrasonic vibration causes the board to deform, thereby increasing displacement of the wiring lines.

The electronic component device according to preferred embodiments of the present invention can be applied to mounting, via bumps, of any chip components as electronic component elements, including a resistor element, capacitor, and piezoelectric component, besides a semiconductor chip, as well as other suitable components and elements.

As is evident from the foregoing, according to various preferred embodiments of the present invention, when a plurality of electrodes of an electronic component is collectively bonded to respective plurality of wiring lines disposed on a board along different directions from each other via respective bumps using ultrasonic vibration, a displacement inhibiting layer having higher rigidity than the material of the board is provided inside the board in a portion below each of the wiring lines of which the angle θ with respect to the direction of ultrasonic vibration is larger. Thereby, the transmission efficiency of ultrasonic vibration becomes substantially uniform, and all wiring lines can be brought into a substantially uniform bonding state. This inhibits the occurrence of imperfect bonding and cracking, thereby providing an high-reliability electronic component device.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. An electronic component device comprising:
a board;
a plurality of wiring lines arranged on the board along different directions, the plurality of wiring lines including first wiring lines extending in a first direction and second wiring lines extending in a second direction different from the first direction;
a plurality of electrodes of an electronic component collectively bonded to the respective plurality of wiring lines via respective bumps on the board; wherein
the board includes a displacement inhibiting layer having higher rigidity than a material of the board, the displacement inhibiting layer being provided inside the board in a portion below each of the second wiring lines and not being provided below each of the first wiring lines.

2. The electronic component device according to claim 1, wherein the first wiring lines and the second wiring lines extend substantially perpendicularly to each other on the board.

3. The electronic component device according to claim 1, wherein a plurality of said second wiring lines is arranged adjacent to each other, and wherein the displacement inhibiting layer is provided in a portion below the plurality of said second wiring lines so as to be continuous.

4. The electronic component device according to claim 1, wherein the displacement inhibiting layer is provided in a region within about 1 mm of an external surface of the board.

5. The electronic component device according to claim 1, wherein the board includes a multilayer printed wiring board, and wherein the displacement inhibiting layer includes a conductor pattern provided in an inner layer of the multilayer printed wiring board.

6. The electronic component device according to claim 1, wherein the board includes an organic board made of one of glass epoxy resin and bismaleimide triazine.

7. The electronic component device according to claim 1, wherein the board includes one of a ceramic board and a crystal board made.

8. The electronic component device according to claim 1, wherein a plurality of displacement inhibiting layers are provided in a region corresponding to the electronic component mounting portion.

9. The electronic component device according to claim 1, wherein the displacement inhibiting layer is disposed within about 10 $\mu$m to about 150 $\mu$m of an external surface of the board.

10. The electronic component device according to claim 1, wherein the displacement inhibiting layer is made of at leased one of a metallic material and a ceramic material.

11. The electronic component device according to claim 1, wherein the material of the board has a rigidity in a range of about 10 GPa to about 60 GPa and the material of the displacement inhibiting layer has a rigidity of about 120 GPa or more.

12. The electronic component device according to claim 1, wherein a thickness of the board is in a range of about 0.2 mm to about 2 mm.

13. The electronic component device according to claim 1, wherein widths of the first and second wiring lines are preferably substantially the same.

14. The electronic component device according to claim 1, wherein the electronic component is one of a semiconductor chip and a surface acoustic wave device.

15. The electronic component device according to claim 1, wherein a plurality of the displacement inhibiting layers are provided in the board except for locations of the first wiring lines.

16. The electronic component device according to claim 15, wherein windows are formed in the plurality of displacement inhibiting layers at locations below the first wiring lines.

17. The electronic component device according to claim 1, wherein the electrodes of the electronic component are ultrasonically bonded via ultrasonic vibration to the respective plurality of wiring lines via respective bumps, and an angle θ formed between a direction of the ultrasonic vibration and the direction of the wiring lines each having the displacement inhibiting layer positioned therebelow is larger than the angle θ formed between the direction of the ultrasonic vibration and the direction of the other wiring lines not having the displacement inhibiting layer positioned therebelow.

* * * * *